United States Patent
Huang et al.

(10) Patent No.: US 8,553,784 B2
(45) Date of Patent: Oct. 8, 2013

(54) METHOD, APPARATUS AND SYSTEM FOR RANDOM LINEAR NETWORK CODING

(75) Inventors: Zhe Huang, Shenzhen (CN); Xianguo Zeng, Shenzhen (CN); Yao Yu, Shenzhen (CN); Haohua Chen, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 406 days.

(21) Appl. No.: 12/981,849

(22) Filed: Dec. 30, 2010

(65) Prior Publication Data

US 2011/0142141 A1   Jun. 16, 2011

Related U.S. Application Data

(63) Continuation of application No. PCT/CN2009/071067, filed on Mar. 30, 2009.

(30) Foreign Application Priority Data

Jul. 3, 2008   (CN) .......................... 2008 1 0126079

(51) Int. Cl.
    *H04B 14/04*   (2006.01)
(52) U.S. Cl.
    USPC ........... 375/242; 375/295; 375/316; 370/254; 370/255; 370/395.1; 708/492
(58) Field of Classification Search
    USPC ................. 375/242, 295, 316; 370/254, 255, 370/395.1; 708/492
    See application file for complete search history.

(56) References Cited

U.S. PATENT DOCUMENTS

| | | | | |
|---|---|---|---|---|
| 6,343,305 | B1 * | 1/2002 | Koç et al. | 708/492 |
| 6,636,882 | B1 * | 10/2003 | Su et al. | 708/492 |
| 2006/0146791 | A1 | 7/2006 | Deb et al. | |
| 2006/0224760 | A1 | 10/2006 | Yu et al. | |
| 2007/0280233 | A1 | 12/2007 | Bush | |
| 2008/0075080 | A1 | 3/2008 | Katabi et al. | |

FOREIGN PATENT DOCUMENTS

| | | |
|---|---|---|
| CN | 1735020 A | 2/2006 |
| CN | 1855733 A | 11/2006 |

OTHER PUBLICATIONS

Wei-jian Guo et al.: "Network Coding and its Application in P2P Network Computer and Information Technology," Computer and Information Technology, vol. 15 No. 1, Feb. 2007, 3 pages.

Tracey Ho et al.: "A Random Linear Network Coding Approach to Multicast," IEEE Transactions on Information Theory, vol. 52, No. 10, Oct. 2006, 18 pages.

(Continued)

*Primary Examiner* — Daniel Washburn
*Assistant Examiner* — Rahel Guarino
(74) *Attorney, Agent, or Firm* — Conley Rose, P.C.; Grant Rodolph; Nicholas K. Beaulieu

(57) ABSTRACT

The present invention relates to network coding and discloses a method, an apparatus, and a system for random linear network coding to prevent the complicated and time-consuming process of network coding. The coding method for random linear network includes: splitting original data into at least two data blocks sequentially; determining at least two coefficient groups, wherein a length of each coefficient group is the same as the number of the data blocks, and the coefficient group comprises two elements; performing a bitwise-AND operation on the data blocks and coefficients corresponding to the data blocks to obtain code blocks; and performing a bitwise-XOR operation between the code blocks to obtain a code packet. The present invention is applicable to the network coding which requires a high efficiency of coding.

18 Claims, 7 Drawing Sheets

(56) References Cited

OTHER PUBLICATIONS

Nathaniel Leibowitz et al.: "Deconstructing the Kazaa Network," IEEE Computer Society, 2003, 9 pages.
Sulin Wei et al.: "Innovative P2P Based Video on Demand System," www.autocontrol.cn, Jun. 16, 2005, 4 pages.
Shuo-Yen Robert Li et al.: "Linear network coding," IEEE Transactions on Information Theory, vol. 49, No. 2, Feb. 2003, 11 pages.
Bin Cheng et al.: "Supporting VCR Functions in P2P VoD Service Using Ring-Assisted Overlays," 2005, 6 pages.
International search report for the corresponding International Application No. PCT/CN2009/071067, Jul. 9, 2009, 28 pages.
Office action issued in corresponding Chinese patent application No. 200810126079.7, dated Feb. 22, 2012, and English translation thereof, total 14 pages.
Written Opinion issued in corresponding PCT application No. PCT/CN2009/071067, dated Jan. 3, 2011, total 5 pages.

* cited by examiner

METHOD, APPARATUS AND SYSTEM FOR RANDOM LINEAR NETWORK CODING

CROSS-REFERENCE TO RELATED APPLICATIONS

This application is a continuation of International Application No. PCT/CN2009/071067, filed on Mar. 30, 2009, which claims priority to Chinese Patent Application No. 200810126079.7, filed on Jul. 3, 2008, both of which are hereby incorporated by reference in their entireties.

FIELD OF THE INVENTION

The present invention relates to network coding, and in particular, to a method, an apparatus, and a system for random linear network coding.

BACKGROUND OF THE INVENTION

Network coding is a specific channel coding known as rateless coding. The transmission model between the transmitting end and the receiving end is relatively simple: The transmitting end sends code packets to the receiving end continuously at the greatest rate, without waiting for feedback information from the receiving end; and the receiving end obtains original data after accumulating enough code packets.

In abstract algebra, a Galois field (also known as a finite field) is a field that includes a finite number of elements (digits). A Galois Field (GF) composed of q elements may be expressed as GF (q). GF operation is defined as a specific cyclic mapping relation between finite elements. Typical GF operations include GF addition and GF multiplication. Due to characteristics of circulation, the finite elements in the GF are correlated with each other to form a finite loop. For any element outside this loop, a modulo operation is performed on the element outside the loop so that the element is mapped to an element in the finite loop. The addition table and the multiplication table of the GF are globally unique. Reverse operation of the GF addition and multiplication exists because the GF addition and multiplication operations are one-to-one mappings. GF(q) addition and multiplication are expressed as:

$$A \oplus B = (A+B) \bmod q$$

$$A \otimes B = (A \times B) \bmod q$$

In the formulas above, $\oplus$ is an adding operator in the GF, $\otimes$ is a multiplying operator in the GF, and mod refers to modulo operation.

In the coding process and the decoding process of the network codes, the original data blocks are operated by performing the GF addition and the GF multiplication. Because the operation in the GF is completely reversible, the decoding process is a reverse process of the coding process.

Coding Process

As shown in FIG. 1, the coding process includes the following steps:
The original data is split into M data blocks (M≥2);
the data blocks are converted into code packets; and
the data blocks may be converted into code packets by using the formula $$Y_k = \sum_{i}^{M} C_{ki} \times X_i, i \in \{1, 2, 3, \ldots, M\},$$

where $Y_k$ represents a code packet k, $X_i$ represents a block i, $C_{ki}$ represents a random coefficient of a block i in the code packet k.

After a GF operation is performed on the data blocks, at least M code packets are generated. The code packets are sent to the receiving end one by one.

$$\begin{bmatrix} C_{11} & C_{12} & C_{13} & \ldots & C_{1M} \\ C_{21} & C_{22} & C_{23} & \ldots & C_{2M} \\ C_{31} & C_{32} & C_{33} & \ldots & C_{3M} \\ \vdots & \vdots & \vdots & \ddots & \vdots \\ C_{k1} & C_{k2} & C_{k3} & \ldots & C_{kM} \\ \vdots & \vdots & \vdots & & \vdots \end{bmatrix} \cdot \begin{bmatrix} X_1 \\ X_2 \\ X_3 \\ \vdots \\ X_M \end{bmatrix} = \begin{bmatrix} Y_1 \\ Y_2 \\ Y_3 \\ \vdots \\ Y_k \\ \vdots \end{bmatrix}$$

Decoding Process

The receiving end receives the code packets and the corresponding random coefficients.

After receiving M linearly independent code packets, the receiving end constructs a linear equation group, where $X_i$ represents M unknown numbers, and $C_{ki}$ and $Y_k$ are parameters included in the code packet.

The linear equation group is solved to obtain the original data.

In the process of transmitting the content by performing the foregoing network coding, the inventor finds that the decoding process corresponding to the network coding in the prior art is rather complicated and takes a long time, which makes the method hardly promotable in the Internet.

SUMMARY OF THE INVENTION

The embodiments of the present invention provide a coding method for random linear network to facilitate the coding process and the decoding process of the network coding and shorten the decoding time significantly.

To fulfill the foregoing objectives, the coding method for random linear network in an embodiment of the present invention includes:
splitting original data into at least two data blocks sequentially;
determining at least two coefficient groups, where the length of each coefficient group is the same as the number of the data blocks, and the coefficient group includes two elements;
In the embodiment, the two elements are 1 and 0.
performing a bitwise-AND operation on the data blocks and coefficients corresponding to the data blocks to obtain code blocks; and
performing a bitwise-XOR operation between the code blocks to obtain code packets.

To fulfill the foregoing objectives, a decoding method for random linear network in an embodiment of the present invention includes:
simplifying coefficient groups in code packets by performing an inverse operation of a bitwise-XOR operation; and
obtaining original data.

The embodiments of the present invention provide an apparatus for random linear network coding to facilitate the coding process and the decoding process of the network coding and shorten the decoding time significantly.

To fulfill the foregoing objectives, an apparatus for random linear network coding in an embodiment of the present invention includes:

a data splitting module, configured to split original data into at least two data blocks sequentially;

a coefficient determining module, configured to determine at least two coefficient groups, where a length of each coefficient group is the same as the number of the data blocks, and the coefficient group includes two elements;

an AND operation module, configured to perform a bitwise-AND operation on the data blocks and coefficients corresponding to the data blocks to obtain code blocks; and an XOR operation module, configured to perform a bitwise-XOR operation on the data blocks to obtain code packets.

To fulfill the foregoing objectives, an apparatus for random linear network decoding in an embodiment of the present invention includes:

a simplifying module, configured to simplify data groups in code packets by performing an inverse operation of a bitwise-XOR operation; and a data obtaining module, configured to obtain original data.

The embodiments of the present invention provide a system for random linear network coding to facilitate the network decoding process and shorten the decoding time significantly.

To fulfill the foregoing objectives, a system for random linear network coding in an embodiment of the present invention includes:

a coding apparatus, configured to allocate coefficients to original data blocks randomly, and convert the original data blocks into code packets by performing a bitwise-AND operation and a bitwise-XOR operation; and a decoding apparatus, configured to simplify and decode the code packets to obtain original data.

By using the method, the apparatus, and the system for random linear network coding in the embodiments of the present invention, in the coding process, GF(2)-based network coding is applied, coefficients are allocated to the original data blocks randomly, and the original data blocks are converted into code packets by performing a bitwise-AND operation and a bitwise-XOR operation; in the decoding process, the non-pivot elements in each code packet are cut down to 0 so that the coefficient matrix of the code packet is finally simplified into a unit matrix and that the corresponding original data is obtained. The decoding process in the present invention prevents the complicated inverse operation of the coefficient matrix, and therefore the decoding process is much simpler and the operation time is shorter than the decoding process in the prior art. The method, the apparatus, and the system for random linear network coding in the embodiments of the present invention implement the network coding and the network decoding more quickly and efficiently.

DETAILED DESCRIPTION OF THE EMBODIMENTS

The decoding process is too complicated and the processing time is too long in the network decoding in the prior art. To solve such problems, the embodiments of the present invention disclose a coding method for random linear network. The method is described below with reference to the accompanying drawings.

Figure 1:
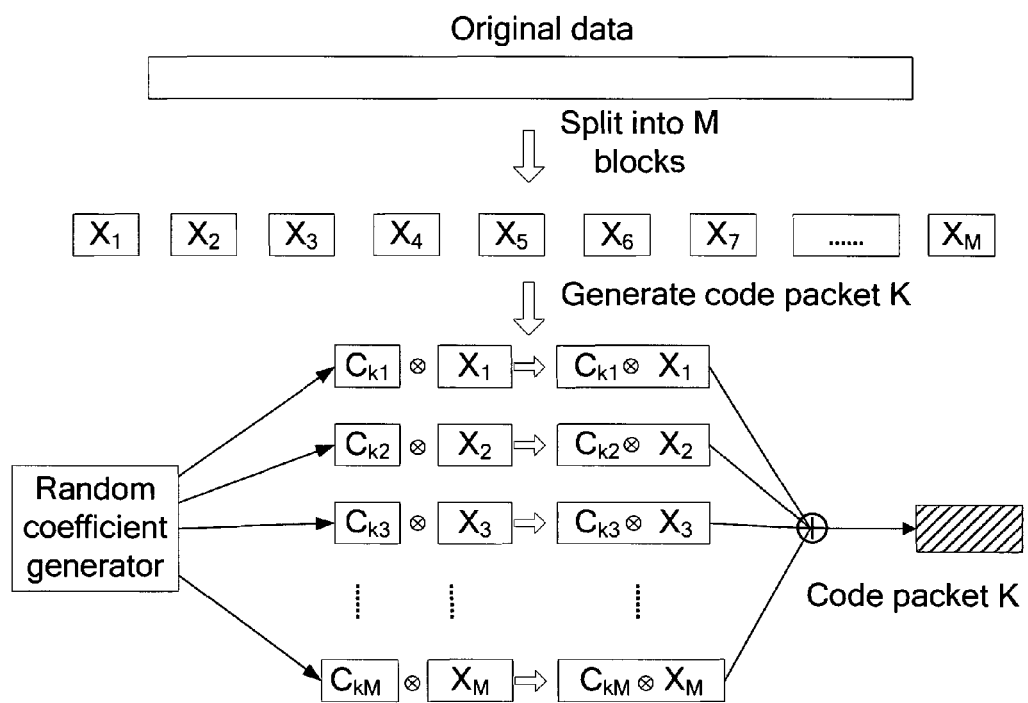
FIG. 1 shows a process of random linear network coding in the prior art.
Figure 2:
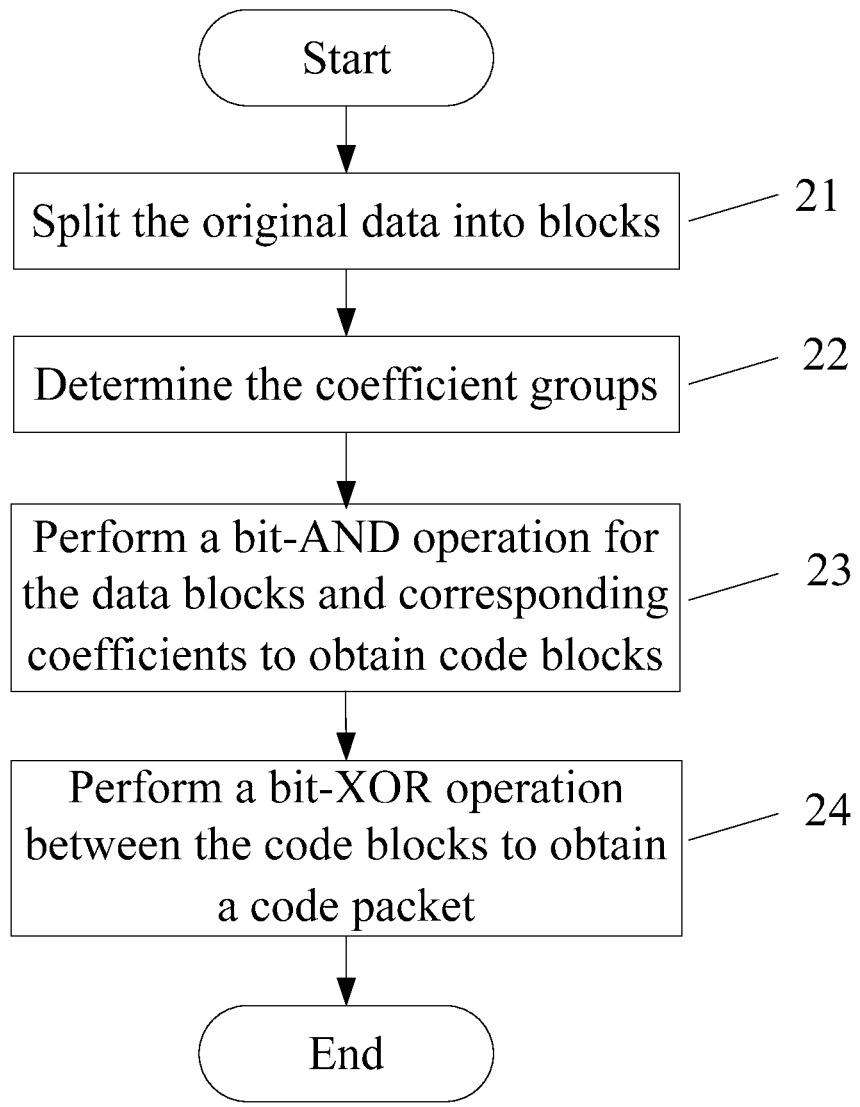
FIG. 2 is a flowchart of a coding method for random linear network in an embodiment of the present invention.

As shown in FIG. 2, the coding method for random linear network in an embodiment of the present invention includes the following steps:

21. Split original data into at least two data blocks sequentially.

22. Determine at least two coefficient group's, where a length of each coefficient group is the same as the number of the data blocks, and the coefficient group includes two elements.

23. Perform a bitwise-AND operation on the data blocks and coefficients corresponding to the data blocks to obtain code blocks.

24. Perform a bitwise-XOR operation between the code blocks to obtain code packets.

By using the coding method for random linear network in the preceding embodiment, the GF(2)-based network coding is applied in the coding process, coefficients are allocated to the original data blocks randomly, and the original data blocks are converted into code packets by performing the bitwise-AND operation and the bitwise-XOR operation. By using the coding method for random linear network in the preceding embodiment, the coding process is much simpler and the operation time is shorter than the coding process in the prior art.

Figure 3:
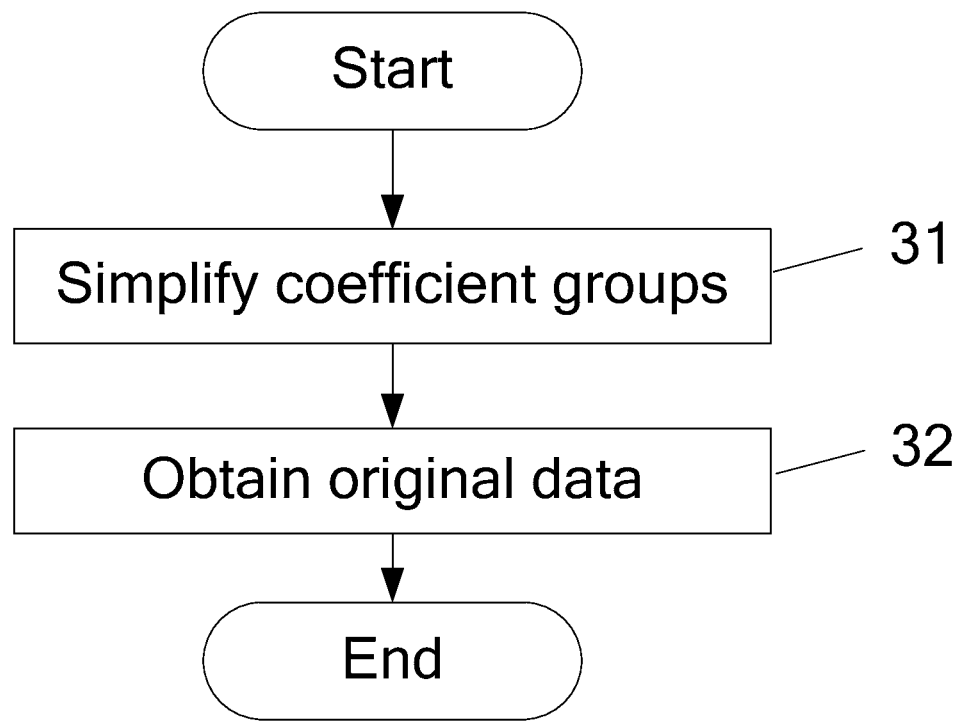
FIG. 3 is a flowchart of a decoding method for random linear network in an embodiment of the present invention.

As shown in FIG. 3, a decoding method for random linear network in an embodiment of the present invention includes the following steps:

31. Simplify coefficient groups in code packets by performing an inverse operation of a bitwise-XOR operation.

32. Obtain original data.

In step 31, the inverse operation of the bitwise-XOR operation is still a bitwise-XOR operation.

By using the decoding method for random linear network in the preceding embodiment, the non-pivot elements in the code packets are set to 0 by performing the bitwise-XOR operation in the decoding process. In this way, the coefficient matrix is simplified to become a unit matrix, and the corresponding original data is obtained. By using the method, the complicated inverse operation of the coefficient matrix is prevented, and therefore the decoding process is much simpler and the operation time is shorter than the decoding process in the prior art.

GF(2) Coding

The GF(2) coding simplifies the coding process. For a codec unit splited to n (n≥2) data blocks, n bits binary digit are generated randomly first, and a bitwise-AND operation is performed between the n bits binary digit and the data blocks corresponding to the bits, wherein data block and 0 make 0; the data block and 1 make the data block itself. In this way, code blocks are obtained. Then, a bitwise-XOR operation is performed on the code blocks to generate a code packet. To sum up, the coding process could be taken as: selecting several data blocks randomly, according to the result of the bitwise-AND operation, to perform the bitwise-XOR operation for obtaining a code packet. It can be seen that, the coding process according to the embodiment of the invention is much simpler than the coding process in the prior art.

Decoding Based on Gaussian Elimination

In the coding method for random linear network in an embodiment of the present invention, the process of simplifying the coefficient groups in the code packets includes: using a Gaussian elimination method to simplify the coefficient matrix of at least two code packets so that the pivot element on each row of the coefficient matrix is 1 and the elements in other positions are 0.

If the current code packet is linearly independent of the previously received code packet, the current code packet includes one pivot element. By using the Gaussian elimination method, all the elements in the corresponding determined pivot element positions are set to 0. The redundant non-0 elements are eliminated to simplify the coefficient groups of the code packets and obtain the pivot element in the code packet coefficient. Then, the new pivot element may be used to further simplify other received code packets.

Figure 4:
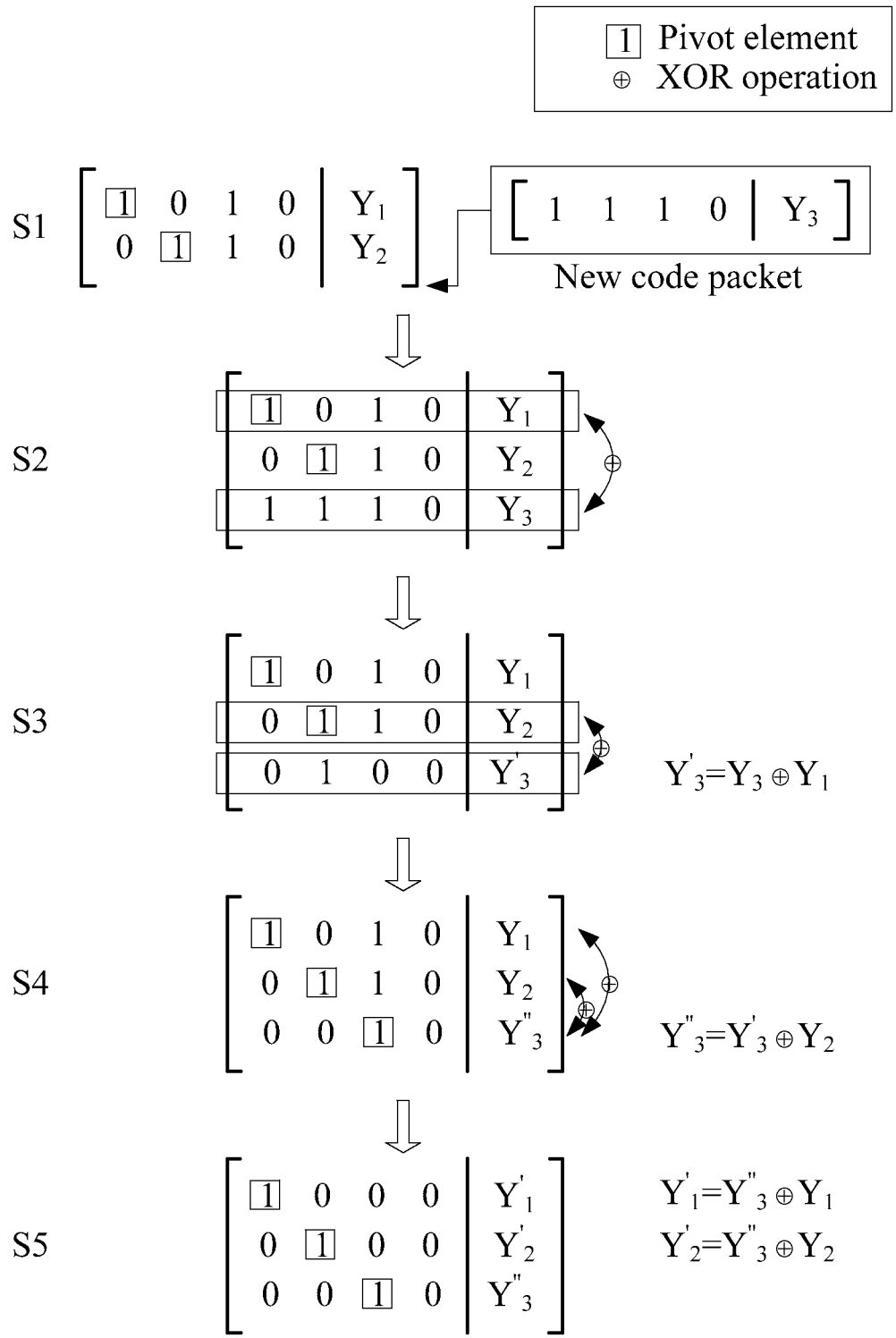
FIG. 4 shows a Gaussian elimination decoding method for random linear network in an embodiment of the present invention.

In the coding method for random linear network in the preceding embodiment, the Gaussian elimination method performs a bitwise-XOR operation on the rows in the coefficient matrix to simplify the coefficient groups in the code packets. The simplification process is described below briefly:

As shown in FIG. 4, n is set to 4; Y1 and Y2 are code packets received and simplified on the receiving end side; and Y3 is a code packet newly received on the receiving end side, and is linearly independent of Y1 and Y2. The process of simplifying the coefficient matrix of the code packets by using a Gaussian elimination method includes the following steps:

S1. Add the coefficient group of a code packet "Y3" into a coefficient matrix.

S2 and S3. If the coefficient group of Y3 includes redundant elements (non-0 elements other than the pivot element), and the pivot elements corresponding to them are already confirmed in the coefficient group of Y1 and Y2, set the redundant elements in the coefficient group of Y3 to 0 according to result of a bitwise-XOR operation.

S4. Because the pivot element in the coefficient group of Y3 is already determined, use Y3 to further simplify other received code packets.

S5. Obtain the simplified coefficient matrix.

The decoding process is not complete until n linearly independent code packets are received, all pivot elements are 1s after simplification, and all redundant elements are eliminated. That is, the objective of the decoding process is to simplify the coefficient matrix of the code packet into a unit matrix based on a Gaussian elimination method.

By using the decoding method based on the Gaussian elimination method in the embodiment above, when the code packet arrives, the data in the code packet can be processed anytime, and the code packet can be processed while being downloaded, thus shortening the decoding time significantly.

Adjustable Coefficient Allocation

Because each independent code packet has only one pivot element, the non-pivot elements may be cut down to 0 to decode the code packet. The number of non-0 coefficients decides the number of times of the XOR operation. In the coding process, the average number of non-0 coefficients in the coefficient groups of code packets may be adjusted to simplify the processing. If the average number of non-0 coefficients in the coefficient groups is very small, the data processing time in the network coding is short.

The process of determining the average number of non-0 coefficients in the coefficient groups is as follows: The transmitting end owns the original data requested by the receiving end; by checking the size of the original data, the transmitting end determines the number (n) of data blocks and the length (L) of the data block. The transmitting end transmits the number (n) of data blocks and the length (L) to the receiving end; and the receiving end returns the software and hardware configuration information of the receiving end; the transmitting end determines a K value according to the configuration information, wherein the K value indicates the average number of non-0 coefficients in all coefficient groups.

For a code packet with n coefficients, if the average number of non-0 coefficients in all coefficient groups is K, the probability of each coefficient being set to 1 is $$\frac{K}{n},$$

and the probability of each coefficient being set to 0 is $$\left(1 - \frac{K}{n}\right).$$

If the K value is small, the data processing time in the network coding is short.

Coefficient Negotiation Protocol

Each code packet received by the receiving end is simplified by using a Gaussian elimination method. The newly received code packet is linearly dependent on the previous code packet, all non-0 coefficients of the newly received code packet will be eliminated, and the code packet will be discarded by the receiving end.

If the receiving end has received plenty of useless code packets linearly dependent on the previous code packets, the speed of decoding on the receiving end side is affected seriously and the decoding time is longer.

A coefficient negotiation protocol is introduced into the coding method for random linear network in this embodiment:

The transmitting end transmits a code packet and the corresponding coefficient group, and the coefficient group of the code packet to be transmitted subsequently to the receiving end;

the receiving end checks whether the code packet to be transmitted subsequently is linearly dependent on the currently received code packet;

if the code packet to be transmitted subsequently is linearly dependent on the currently received code packet, the receiving end sends a rejection signal to the transmitting end, and sends a linearly independent coefficient group to the transmitting end at the same time; and the transmitting end receives the coefficient group, generates a new code packet according to the coefficient group, and sends it to the receiving end.

Due to network delay and packet loss, it is possible that multiple packets are transmitted in the network simultaneously. To cope with such a circumstance, two or more coefficient groups of the code packets to be transmitted subsequently are embedded into the current code packet.

To make the present invention clearer, the following describes the technical solution under the present invention in more detail with reference to a preferred embodiment.

Transmitting End Embodiment

The transmitting end owns a complete copy of the original data requested by the receiving end. By checking the size of the original data, the transmitting end determines the number (n) of data blocks and the length (L) of the data block dynamically. The transmitting end uses a handshake protocol to transmit the number of data blocks and the length of the data block to the receiving end; and the receiving end returns information about potential computation capability of the receiving end as a response. In this way, the transmitting end can determine a proper K value, where the K value indicates the average number of non-0 coefficients in all coefficient groups.

If the K value is determined, the transmitting end starts transmission. The number of non-0 coefficients in the coefficient groups allocated to each code packet randomly is limited by the K value. If the number of data blocks is n, namely, the size of the coefficient matrix is n×n and each coefficient group includes n binary coefficients, the probability of each coefficient being 1 is $$\frac{K}{n},$$

and the probability of each coefficient being 0 is $$\left(1 - \frac{K}{n}\right).$$

Code packets are generated according to the coefficients in the current coefficient group. First, a storage space is allocated to the data to be output, and the output data is initialized to a 0 vector. Then, the current coefficient group is scanned from left to right. If the coefficient in position i is not 0, a bitwise-XOR operation is performed for block i and the output data to generate a code packet. Subsequently, the transmitting end binds the two predictive coefficient groups (namely, comprising coefficient groups allocated to the code packet to be sent) to the code packet, and sends them to the receiving end.

After the code packet is sent, the first predictive coefficient group becomes the current coefficient group, and the second predictive coefficient group becomes the first predictive coefficient group. The transmitting end generates a new second predictive coefficient group automatically.

In the sending process, if the transmitting end receives a report related to coefficients of a code packet from the receiving end, that means at least one of the two predictive coefficient groups will make the transmitting end generate a code packet which is linearly dependent on the code packet already received by the receiving end. The transmitting end uses the coefficient group proposed by the receiving end to replace the predictive coefficient group which is linearly dependent on the coefficient group in the code packet already received by the receiving end.

Receiving End Embodiment

The receiving end shakes hands with the transmitting end to know the number of data blocks and the length of the data block, and then initializes the relevant devices.

The decoding process is driven by the received code packet. When the code packet is received, three coefficient groups included in the code packet are processed first. An attempt is made to locate the pivot element in the coefficient group. First, each recovered pivot element is checked in the pivot element table. For the pivot element in position i, if the coefficient in the corresponding position of the newly received coefficient group is non-0, an XOR operation is performed for this newly received coefficient group and the coefficient group that owns the pivot element to eliminate the non-0 coefficient. After all non-0 coefficients corresponding to the determined pivot element position are eliminated in the newly received coefficient group, the coefficient group is simplified.

If the simplified coefficient group includes no non-0 element, the coefficient group is linearly dependent on the previously received data packet. If the coefficient group linearly dependent on the received code packet is the current coefficient group, the newly received data packet is discarded; if the coefficient group linearly dependent on the received code packet is the predictive coefficient group, a rejection message and a proposed coefficient group are sent to the transmitting end. The proposed coefficient group is linearly independent of the coefficients of the received code packet.

After all pivot elements are determined, the code packet is decoded and the original data is recovered. In the coefficient group of each stored code packet, non-0 elements exist only in the corresponding pivot element position. After the original data is recovered in the code packet, the receiving end reports decoding success to the transmitting end.

The foregoing embodiment of the coding method for random linear network describes a process of sending and receiving only one codec unit (n×L bytes). Generally, the size of one unit is moderate. Therefore, a content to be transmitted needs to be split into multiple continuous codec units logically. The receiving end generally downloads the codec units sequentially, and requests data from multiple transmitting ends simultaneously. After receiving the download request, the transmitting end encodes the data of the requested codec unit, and sends a code packet to the receiving end. The receiving end obtains the code packet of the requested codec unit from multiple transmitting ends. After enough code packets are obtained and the original data of the codec unit is obtained by decoding, the receiving end notifies the transmitting end that the receiving is complete, and may request the next codec unit. After receiving the completion report from the receiving end, the transmitting end starts sending the code packet of the next requested codec unit.

In the embodiment GF(2)-based network coding is applied in the coding process, the coding coefficients are either 0 or 1, and a bitwise-XOR operation is performed for the original data blocks to generate code packets, which simplifies the coding process. In the coding method for random linear network in the embodiment above, a Gaussian elimination method is applied in the decoding process so that the coefficient matrix of the code packet is ultimately simplified into a unit matrix and that the original data is recovered. This method prevents the complicated inverse operation for the matrix and shortens the decoding time. The coding method for random linear network in the embodiment above accomplishes adjustable coefficient allocation and adjusts the complexity of coding and decoding for different devices. In the coding method for random linear network in the embodiment above, a coefficient negotiation protocol is put forward. The receiving end judges whether to receive a code packet by detecting the coefficient group of the code packet to be received subsequently, thus reducing the probability of linear dependence of the code packets, and saving time and resources required for decoding the linearly dependent code packets. In the coding method for random linear network in the embodiment above, the computation device performs fast coding and decoding at a very high throughput, and minimizes the communication overhead caused by linear dependence of the code packets.

The decoding process is too complicated and the processing time is too long in the network decoding in the prior art. To solve such problems, the embodiments of the present invention disclose an apparatus for random linear network coding. The apparatus is described below in more detail with reference to the accompanying drawings.

Figure 5:
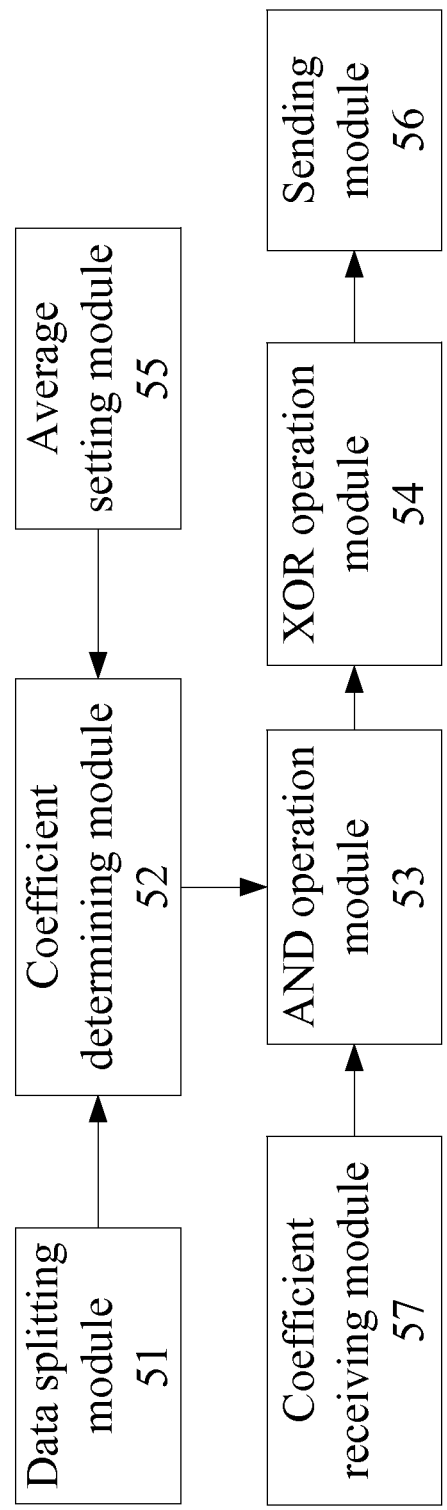
FIG. 5 shows a structure of an apparatus for random linear network coding in an embodiment of the present invention.

As shown in FIG. 5, the apparatus for random linear network coding in an embodiment of the present invention includes:

a data splitting module 51, configured to split original data into at least two data blocks sequentially;

a coefficient determining module 52, configured to determine at least two coefficient groups, where a length of each coefficient group is the same as the number of the data blocks, and the coefficient group includes two elements;

an AND operation module 53, configured to perform a bitwise-AND operation on the data blocks and coefficients corresponding to the data blocks to obtain code blocks; and an XOR operation module 54, configured to perform a bitwise-XOR operation on the data blocks to obtain code packets.

The apparatus for random linear network coding in this embodiment further includes an average setting module 55, which is configured to set average number (K) of non-0 coefficients in all coefficient groups. In this case, the coefficient determining module 52 is configured to generate at least two coefficient groups randomly, where the probability of a specific coefficient being 1 in each coefficient group is $$\frac{K}{\text{length of coefficient group}},$$

and the probability of a specific coefficient being 0 in each coefficient group is $$1 - \frac{K}{\text{length of coefficient group}}.$$

The apparatus for random linear network coding in this embodiment further includes a sending module 56, which is configured to send code signals that include the code packet.

The sending module 56 is further configured to send the code signals that include the code packet and coefficient groups of at least one subsequent code packet.

The apparatus for random linear network coding in this embodiment further includes a coefficient receiving module 57, which is configured to receive a coefficient group sent by the receiving end.

Figure 6:
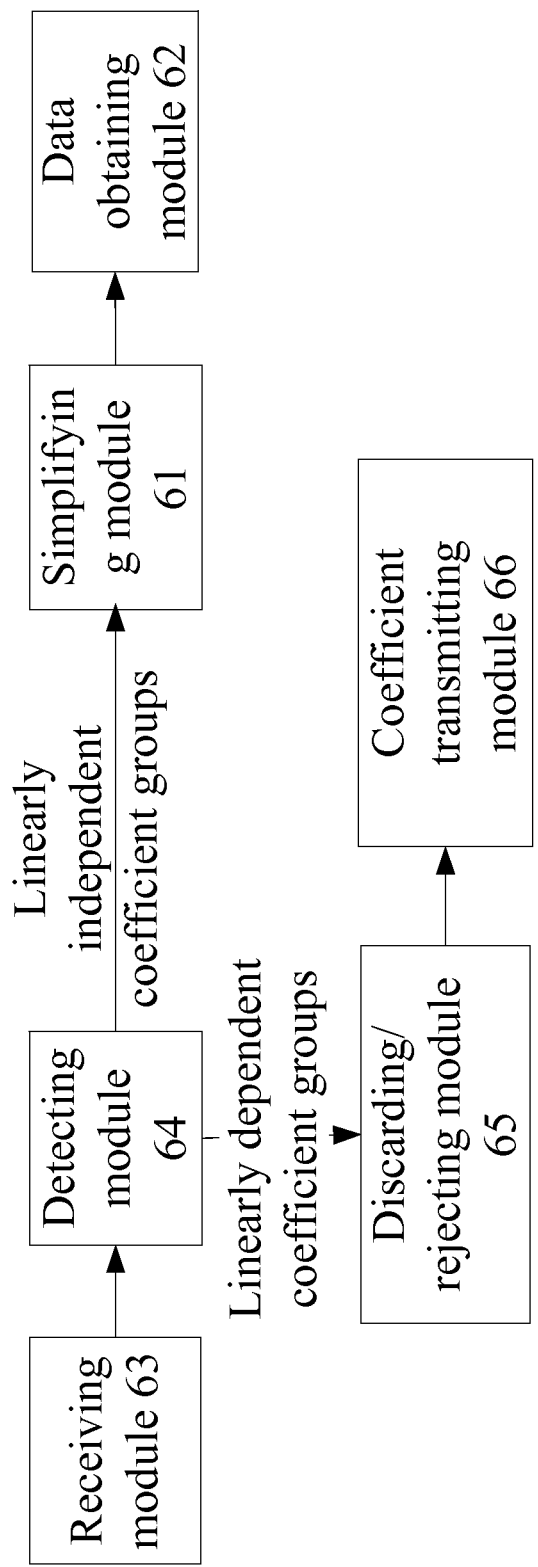
FIG. 6 shows a structure of an apparatus for random linear network decoding in an embodiment of the present invention.

As shown in FIG. 6, an apparatus for random linear network decoding in an embodiment of the present invention includes:

a simplifying module 61, configured to simplify data groups in code packets by performing an inverse operation of a bitwise-XOR operation; and a data obtaining module 62, configured to obtain original data.

The apparatus for random linear network decoding in this embodiment further includes a receiving module 63, which is configured to receive code signals that include the code packet.

The receiving module 63 is further configured to receive the code signals that include the code packet and coefficient groups of at least one subsequent code packet.

The apparatus for random linear network decoding in this embodiment further includes:

a detecting module 64, configured to check whether the coefficient groups in the received code packet are linearly dependent on the coefficient groups of the previously received code packet; and a discarding/rejecting module 65, configured to send an instruction for discarding the linearly dependent code packet.

The detecting module 64 is further configured to check whether the coefficient groups in the subsequent code packet are linearly dependent on the coefficient groups of the previously received code packet.

The discarding/rejecting module 65 is further configured to send an instruction for rejecting the code packet corresponding to the linearly dependent coefficient groups of the subsequent code.

The apparatus for random linear network decoding in this embodiment further includes a coefficient transmitting module 66, configured to transmit a coefficient group linearly independent of the received coefficient group to the transmitting end after rejecting the code packet.

In the apparatus for random linear network decoding in this embodiment, the simplifying module 61 includes:

a coefficient group adding unit, configured to add the coefficient groups of the code packet into an existing coefficient matrix;

an XOR simplifying unit, configured to eliminate non-0 elements other than the pivot element in the coefficient groups of the code packet by performing a bitwise-XOR operation; and a matrix simplifying unit, configured to further simplify the existing coefficient matrix.

Through the apparatus for random linear network coding in the embodiment above, in the coding process, GF(2)-based network coding is applied, coefficients are allocated to the original data blocks randomly, the original data blocks are converted into code packets by performing a bitwise-AND operation and a bitwise-XOR operation; in the decoding process, the non-pivot elements in each code packet are cut down to 0 so that the coefficient matrix of the code packet is simplified into a unit matrix and that the corresponding original data is obtained. The decoding process in the present invention prevents the complicated inverse operation of the coefficient matrix, and therefore, the decoding process is much simpler and the operation time is shorter than the decoding process in the prior art.

The decoding process is too complicated and the processing time is too long in the network decoding in the prior art. To solve such problems, the embodiments of the present invention disclose a system for random linear network coding, which is described below in more detail with reference to accompanying drawings.

Figure 7:
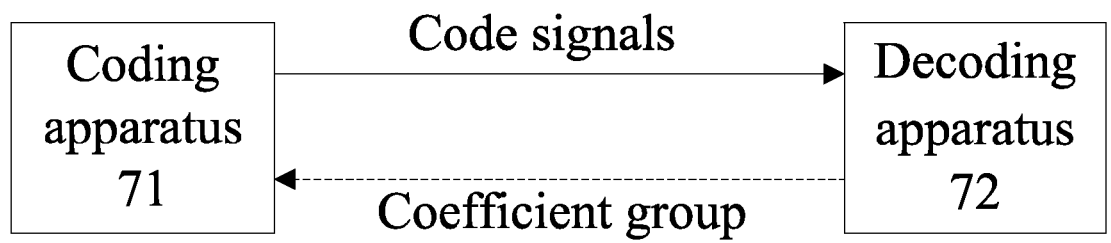
FIG. 7 shows a structure of a system for random linear network coding in an embodiment of the present invention.

As shown in FIG. 7, the system for random linear network coding in an embodiment of the present invention includes:

a coding apparatus 71, configured to allocate coefficients to original data blocks randomly, and convert the original data blocks into code packets by performing a bitwise-AND operation and a bitwise-XOR operation; and a decoding apparatus 72, configured to simplify and decode the code packets to obtain original data.

The coding apparatus 71 includes:

a data splitting module, configured to split original data into at least two data blocks sequentially;

a coefficient determining module, configured to determine at least two coefficient groups, where a length of each coefficient group is the same as the number of the data blocks, and the coefficient group includes two elements;

an AND operation module, configured to perform a bitwise-AND operation on the data blocks and coefficients corresponding to the data blocks to obtain code blocks; and an XOR operation module, configured to perform a bitwise-XOR operation on the data blocks to obtain code packets.

The decoding apparatus 72 includes:

a simplifying module, configured to simplify data groups in code packets by performing an inverse operation of a bitwise-XOR operation; and a data obtaining module, configured to obtain original data.

Through the system for random linear network coding in the embodiment above, in the coding process, GF(2)-based network coding is applied, coefficients are allocated to the original data blocks randomly, the original data blocks are converted into code packets by performing a bitwise-AND operation and a bitwise-XOR operation; in the decoding process, the non-pivot elements in each code packet are cut down to 0 so that the coefficient matrix of the code packet is simplified to become a unit matrix and that the corresponding original data is obtained. The decoding process in the present invention prevents the complicated inverse operation of the coefficient matrix, and therefore the decoding process is much simpler and the operation time is shorter than the decoding process in the prior art.

What is claimed is:

1. A random linear network coding method implemented by a transmitting end, comprising:
    splitting, by the transmitting end, original data into at least two data blocks sequentially;
    determining, by the transmitting end, at least two coefficient groups, wherein a length of each coefficient group is the same as the number of the data blocks, wherein each coefficient group comprises two elements, and wherein the two elements in the coefficient groups comprise 0 and 1;
    performing, by the transmitting end, a bitwise-AND operation on the data blocks and coefficients corresponding to the data blocks to obtain code blocks;
    performing, by the transmitting end, a bitwise-XOR operation between the code blocks to obtain a code packet; and
    setting, by the transmitting end, an average number "K" of non-0 coefficients in all coefficient groups before determining the at least two coefficient groups.

2. The random linear network coding method implemented by the transmitting end according to claim 1, wherein determining the at least two coefficient groups comprises:
    generating at least two coefficient groups randomly,
    wherein a probability of a specific coefficient being 1 in each coefficient group is a value calculated by the formula $$\frac{K}{\text{length of coefficient group}},$$

wherein a probability of a specific coefficient being 0 in each coefficient group is a value calculated by the formula $$1 - \frac{K}{\text{length of coefficient group}}.$$

and
    wherein K indicates an average number of non-0 coefficients in all coefficient groups.

3. The random linear network coding method implemented by the transmitting end according to claim 1, further comprising at least one step of the following:
    sending, by the transmitting end, code signals that comprise the code packet; and
    sending, by the transmitting end, code signals that comprise the code packet and coefficient groups of at least one subsequent code packet.

4. The random linear network coding method implemented by the transmitting end according to claim 3, further comprising receiving, by the transmitting end, receiving a coefficient group sent by a receiving end.

5. A random linear network decoding method implemented by a receiving end, comprising:
    adding, by the receiving end, coefficient groups of a code packet into an existing coefficient matrix;
    performing, by the receiving end, a bitwise-XOR operation to eliminate non-0 elements other than pivot elements in the coefficient group if the coefficient group comprises any non-0 elements other than the pivot elements and the pivot elements corresponding to the non-0 elements are already confirmed in the existing coefficient matrix;
    simplifying, by the receiving end, the existing coefficient matrix using the coefficient groups after determining the pivot elements in the coefficient groups; and
    obtaining, by the receiving end, original data.

6. The random linear network decoding method implemented by the receiving end according to claim 5, further comprising receiving, by the receiving end, code signals that comprise the code packet.

7. The random linear network decoding method implemented by the receiving end according to claim 6, further comprising:
    checking, by the receiving end, whether the coefficient groups in the code packet are linearly dependent on coefficient groups of a received code packet; and
    discarding, by the receiving end, the code packet when the coefficient groups in the code packet are linearly dependent on coefficient groups of the received code packet.

8. The random linear network decoding method implemented by the receiving end according to claim 5, further comprising receiving, by the receiving end, code signals that comprise the code packet and coefficient groups of at least one subsequent code packet.

9. The random linear network decoding method implemented by the receiving end according to claim 8, further comprising:
  checking, by the receiving end, whether the coefficient groups in the at least one subsequent code packet are linearly dependent on coefficient groups of a received code packet;
  rejecting, by the receiving end, the code packet corresponding to the coefficient groups when the coefficient groups in the at least one subsequent code packet are linearly dependent on coefficient groups of the received code packet; and
  transmitting, by the receiving end, a coefficient group linearly independent of the received coefficient groups of the code packet to a transmitting end.

10. An apparatus for random linear network coding, comprising:
  a data splitting module configured to split original data into at least two data blocks sequentially;
  a coefficient determining module configured to determine at least two coefficient groups, wherein a length of each coefficient group is the same as the number of the data blocks, and wherein each coefficient group comprises two elements;
  an AND operation module configured to perform a bitwise-AND operation on the data blocks and coefficients corresponding to the data blocks to obtain code blocks;
  an XOR operation module configured to perform a bitwise-XOR operation on the data blocks to obtain code packets; and
  an average setting module configured to set average number "K" of non-0 coefficients in all coefficient groups,
  wherein K indicates an average number of non-0 coefficients in all coefficient groups,
  wherein the coefficient determining module is configured to generate at least two coefficient groups randomly,
  wherein a probability of a specific coefficient being 1 in each coefficient group is a value calculated by the formula $$\frac{K}{\text{length of coefficient group}},$$

and
  wherein a probability of a specific coefficient being 0 in each coefficient group is a value calculated by the formula $$1 - \frac{K}{\text{length of coefficient group}}.$$

11. The apparatus for random linear network coding according to claim 10, further comprising a sending module configured to send code signals that comprise the code packet.

12. The apparatus for random linear network coding according to claim 11, further comprising a coefficient receiving module configured to receive a coefficient group sent by a receiving end.

13. An apparatus for random linear network decoding, comprising:
  a simplifying module configured to simplify data groups in a code packet by performing an inverse operation of a bitwise-XOR operation,
  wherein the simplifying module comprises:
    a coefficient group adding unit configured to add the coefficient groups of the code packet into an existing coefficient matrix;
    an XOR simplifying unit configured to eliminate non-0 elements other than pivot elements in the coefficient groups of the code packet by performing a bitwise-XOR operation;
    a matrix simplifying unit configured to further simplify the existing coefficient matrix; and
  a data obtaining module configured to obtain original data.

14. The apparatus for random linear network decoding according to claim 13, further comprising a receiving module configured to receive code signals that comprise the code packet.

15. The apparatus for random linear network decoding according to claim 14, further comprising:
  a detecting module configured to check whether coefficient groups in the code packet are linearly dependent on coefficient groups of a received code packet; and
  a discarding/rejecting module configured to send an instruction for discarding the linearly dependent code packet.

16. The apparatus for random linear network decoding according to claim 14, wherein the receiving module is further configured to receive code signals that comprise the code packet and coefficient groups of at least one subsequent code packet.

17. The apparatus for random linear network decoding according to claim 15, wherein the detecting module is further configured to check whether the coefficient groups in the at least one subsequent code packet are linearly dependent on the coefficient groups of the received code packet, and wherein the discarding/rejecting module is further configured to send an instruction for rejecting the code packet corresponding to the linearly dependent coefficient groups.

18. The apparatus for random linear network decoding according to claim 17, further comprising a coefficient transmitting module configured to transmit a coefficient group linearly independent of the received coefficient group to a transmitting end.

* * * * *

UNITED STATES PATENT AND TRADEMARK OFFICE
CERTIFICATE OF CORRECTION

| | |
|---|---|
| PATENT NO. | : 8,553,784 B2 |
| APPLICATION NO. | : 12/981849 |
| DATED | : October 8, 2013 |
| INVENTOR(S) | : Zhe Huang et al. |

Page 1 of 1

It is certified that error appears in the above-identified patent and that said Letters Patent is hereby corrected as shown below:

In the Claims

Column 12 Line 39, claim 4 should read: "The random linear network coding method implemented by the transmitting end according to claim 3, further comprising receiving, by the transmitting end, a coefficient group sent by a receiving end."

Signed and Sealed this
Eighth Day of April, 2014

Michelle K. Lee
*Deputy Director of the United States Patent and Trademark Office*